United States Patent [19]

Imamura et al.

[11] 4,286,049
[45] Aug. 25, 1981

[54] METHOD OF FORMING A NEGATIVE RESIST PATTERN

[75] Inventors: Saburo Imamura; Shungo Sugawara; Hirotsugu Sato, all of Mito, Japan

[73] Assignee: Nippon Telegraph and Telephone Public Corporation, Tokyo, Japan

[21] Appl. No.: 54,430

[22] Filed: Jul. 3, 1979
(Under 37 CFR 1.47)

[30] Foreign Application Priority Data

Jul. 10, 1978 [JP] Japan ................................. 53-83842

[51] Int. Cl.³ .......................... B05D 3/06; G03C 5/16
[52] U.S. Cl. .................................. 430/296; 430/325; 430/270; 430/287
[58] Field of Search ............... 430/296, 325, 967, 270, 430/287, 905, 907

[56] References Cited

U.S. PATENT DOCUMENTS

| | | | |
|---|---|---|---|
| 3,457,073 | 7/1969 | Delzenne | 430/270 |
| 3,535,137 | 10/1970 | Haller et al. | 430/322 |
| 3,622,321 | 11/1971 | Smets | 430/270 |
| 3,740,376 | 6/1973 | Wolff et al. | 430/167 |
| 3,794,510 | 2/1974 | Scala et al. | 430/296 |
| 3,996,393 | 12/1976 | Cortellino et al. | 430/270 |

OTHER PUBLICATIONS

Brewer: Factors Affecting the Sensitivity of E-Beam Resists, Polymer Engineering and Science, Jul. 1974, vol. 14, No. 7, pp. 534–537.

Primary Examiner—Won H. Louie, Jr.
Attorney, Agent, or Firm—Frishauf, Holtz, Goodman & Woodward

[57] ABSTRACT

A method for forming a negative resist pattern which applies as a high energy beam-sensitive material a polymer consisting of components expressed by the general structural formula:

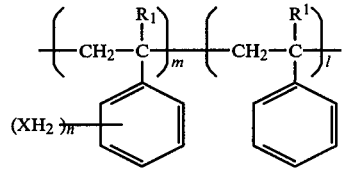

where:
X=halogen or

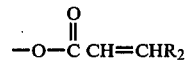

($R_2$ is H or $CH_3$)
$R_1$ = H or $CH_3$
n = 1 to 3
m, l = integers having a relationship of $50 \leq m+1 \leq 50,000$.

9 Claims, 5 Drawing Figures

METHOD OF FORMING A NEGATIVE RESIST PATTERN

This invention relates to a method of forming a negative resist mask pattern used in the making of, for example, semiconductor elements, magnetic bubble elements and parts produced by radiation of high energy beams.

Hitherto, the manufacture of, for example, a semiconductor integrated circuit has been carried out by applying a photosensitive resin layer (or photo resist) on the surface of a substrate, exposing it to light rays, and providing a fine resist pattern by development, and removing the other portion of the substrate than the resist mask by wet etching.

With such conventional pattern-forming method based on exposure to light rays, the degree of resolution is limited to several microns due to the effect of, for example, diffraction. Moreover, wet etching is not adapted for the minute work of providing a fine pattern smaller than 1 micron due to the occurrence of side etching or the effect of impurities contained in an etchant. In recent years, it is demanded to manufacture a semiconductor integrated circuit with a higher density. Therefore, the trend goes to the process of replacing light rays by high energy radiation such as deep ultraviolet rays, X-rays, electron beams and gamma rays to form a resist pattern with a high precision and replacing wet etching by dry etching based on gas plasma, reactive sputtering or ion milling.

A polymer film adapted for the making of a resist pattern by radiation followed by dry etching should not only highly react with radiation, but also ensure a high degree of resolution finer than 1 micron and have a great resistance to, for example, reactive sputtering or ion milling. To attain this object, a large number of resist materials have been studied to determine whether they meet the above-mentioned requirements. However, very few resist materials have been found to satisfy all such requisite conditions. For example, epoxidized 1,4-polybutadiene (hereinafter abbreviated as "EPB") known as a negative resist mask material is found to have a relatively low resolution degree of 1.5 microns, though being very sensitive to radiation, for example, electron beams of $10^{-8}$ Coulomb/cm$^2$.

On the other hand, poly methyl methacrylate (abbreviated as "PMMA") known as a positive resist material has a relatively large $\gamma$ value of about 2.5 (this $\gamma$ value denotes the ratio of changes in the thickness of a resist material remaining after development to changes in the dosage of high energy radiation, and is generally used as a guide to judge the resolution degree of the resist material. A larger $\gamma$ value of a resist material is considered to show its higher resolution degree.)

The poly methyl methacrylate is known to provide a fine resist pattern of the order of submicrons. However, this resist material undesirably has a low radiation sensitivity as $10^{-4}$ to $10^{-5}$ Coulomb/cm$^2$ (as measured at accelerated electron voltage of 20 KV). Referring to resistance to a dry etchant such as high energy radiation, the poly methyl methacrylate has an etching rate little different from that of a substrate as indicated in the later described Tables 1 and 2, and consequently proves unadapted for dry etching.

The known positive photoresist material, for example, naphthoquinonediazido-based resist material (which is sold under a trademark of AZ-1350J by Shipley Co. Ltd. U.S.A.) has a great resistance to a dry etchant, and is as slow in etching rate as shown in the later described Tables 1 and 2. However, the conventional positive photoresist material undesirably has as low a radiation sensitivity as $5 \times 10^{-5}$ Coulomb/cm$^2$.

This invention has been accomplished in view of the above-mentioned circumstances and is intended to provide a method of producing a resist material having a high sensitivity to high energy radiation, a high degree of resolution and a great resistance to a dry etchant and also forming a resist pattern from said resist material which consists of finer lines than 1 micron.

To attain the above-mentioned object, this invention provides a negative resist pattern-forming method, which comprises the steps of:

(a) depositing a polymer layer sensitive to high energy radiation on a substrate;

(b) exposing the polymer layer to high energy radiation in the prescribed pattern to crosslink the exposed portions of the polymer layer; and (c) eliminating the portions other than the crosslinked portions of said polymer layer by a solvent.

The polymer layer used in the above-mentioned process of forming a negative resist pattern consists of components expressed by the general structual formula:

where:
X = an optional combination of the same or different groups selected from the group consisting of halogens and compounds expressed by the formula ($R_2$ is a hydrogen atom or methyl group)
$R_1$ = a hydrogen atom or methyl group
n = an integer of 1, 2 or 3
$l + m$ = an integer of 50 to 50,000.

This invention can be more fully understood from the following detailed description when taken in conjunction with the accompanying drawings, in which.

This invention provides a method of forming a negative resist mask pattern by applying high energy radiation, for example, deep ultraviolet rays, X-rays, electron beam or γ rays and dry ethcing (a method to evaporate a substrate material by impinging thereon a gas plasma, ion and the like), for example, by gas plasma, reactive sputtering or ion milling, the improvement being that the material of the resist is prepared from a polymer which is sensitive to high energy radiation and is formed of components expressed by the general formula:

where:
X=an optional combination of the same or different groups selected from the group consisting of halogens and compounds expressed by the formula $$-\overset{O}{\underset{\|}{OC}} CH=CHR_2$$

($R_2$ is a hydrogen atom or methyl group). In this case, a plurality of —$CH_2X$ group may be bonded to the same benzene nucleus and X may represent a combination of the same or different groups in the chain of .

n=an integer of 1, 2 or 3
l+m=an integer of 50 to 50,000, or preferably 100 to 10,000.

Generally, a polymer containing the component, —$CH_2X$ at a ratio of m/(l+m) (or chloromethylation degree)≧0.2 is employed. The numeral limitations of l+m in the above formula may be explained as follows. Practically, a resist material is required to have a sensitivity of more than $10^{-5}$ Coulomb/cm². In order to obtain a resist material having a sensitivity of more than $10^{-5}$ Coulomb/cm² according to this invention, the molecular weight of the resist material is required to be at least 10,000 as exemplified in FIG. 3. Accordingly, the number of l+m in the above formula should be at least 50. On the other hand, if the number of l+m is exceeded more than 50,000, such a polymer is liable to change into a gel and difficult to manufacture.

Solvents used to dissolve the portions of the polymer other than the portions which is crosslinked by the application of high energy radiation include ethyl acetate, n-amyl acetate, n-butyl acetate, benzene, toluene, xylene, ethylcellosolve, acetone, methylethyl ketone and methyl isobutyl ketone.

Polystyrene or poly α-methylstyrene constituting the main component of the subject polymer can be obtained in the approximately monodisperse form in which polydispersitizies of polymer are 1.01∼1.04 by living polymerization, and consequently is very much preferred from the standpoint of elevating the resolution degree. As used in this invention, the polydispersivity of polystyrene should preferably be distributed in the range of less than 1.2 from the standpoint of practical application.

There will now be described various processes of manufacturing a polymer used in this invention which is sensitive to high energy radiation.

Process 1

This process relates to the manufacture of a polymer in which the character X of the structural formula denotes chlorine (Cl).

Figure 1:
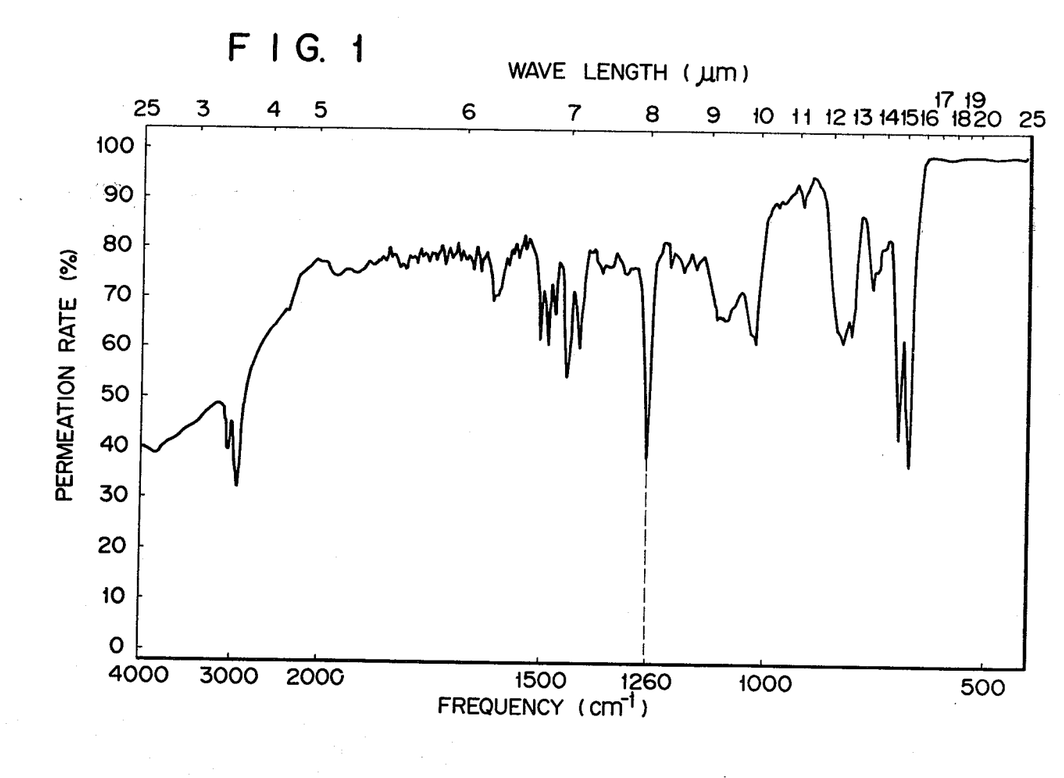
FIG. 1 is an infrared absorbtion spectrum of chloromethylated polystyrene used in this invention.

1 g of polystyrene having an weight average molecular weight of 10,000 and a molecular dispersivity of 1.04 was dissolved in 40 cc of chloromethyl methyl ether. Dripped into the resultant solution was a solution prepared by diluting 1.6 cc of stannic tetra chloride with 15 cc of chloromethyl methyl ether. The mixed mass was reacted 90 minutes at 0° C. The reaction product was recovered by reprecipitation, with methanol used as a medium. The recovered reaction product was washed 3 hours with hot methanol. A white polymer thus prepared was dried by freezing to be used as a sample. FIG. 1 shows the infrared absorption spectrum of the produced polymer, in which a chloromethyl group was prominently absorbed at a wave number of 1260 ($cm^{-1}$). The elemental analysis of the polymer indicated 74.2% by weight of carbon, 6.0% by weight of hydrogen and 19.8% by weight of chlorine. The polystyrene was chloromethylated at the rate of 80% as measured by element analysis.

Process 2

This process explains the manufacture of a polymer which is similar to that of process 1 excepting the average molecular weight and the distribution of molecular weight.

1 g of polystyrene having an weight average molecular weight of 428,000 and a molecular weight polydispersivity of 1.01 was dissolved in 40 cc of chloromethyl methyl ether. Then, a solution prepared by diluting 1.6 cc of zinc tetrachloride with 15 cc of chloromethyl-methyl-ether was dripped into the solution of the polystyrene. The mixture was reacted 90 minutes at 0° C. The resultant product was washed with methanol for 3 hours. The white polymer thus prepared was freeze-dried to be used as a resist sample.

The elemental analysis of the polymer indicated chlorine content of 21.3% by weight and chloromethylation degree (m/l+m) of 0.88.

Process 3

This process relates to the manufacture of a polymer in which the character X of the general structural formula represents a combination of bromine (Br) and chlorine (Cl).

10 g of chloromethylated polystyrene was dissolved in 50 ml of N, N'-dimethyl formamide. 12 g of crushed and dried KBr was added to the solution, with reaction continued 3 hours at 80° C. The reacted mixture was poured into water. After taken out of the water, the mixture was rinsed with water and then methyl-alcohol. Thereafter, the reaction product was dried at reduced pressure, providing 11 g of polymer.

Process 4

A polymer in which the character X of the general structural formula denoted a combination of clorine (Cl) and iodine (I) was manufactured by the following process.

10 g of the chloromethylated polystyrene prepared by the process 1 was dissolved in 50 ml of N, N'-dimethyl formamide. 12 g of crushed and dried KI was added to the solution, with reaction continued 3 hours at 80° C. The reacted mixture was poured into water. After taken out of the water, the mixture was rinsed with water and then methyl alcohol. The reaction product was dried at reduced pressure, providing 9 g of polymer.

Process 5

A polymer in which the character X of the general structural formula represented a combination of chlorine (Cl) and a group expressed by the formula of was prepared by the following process.

10 g of the chloromethylated polystyrene obtained by the process 1 was dissolved in 50 ml of N, N'-dimethyl formamide.

12 g of crushed and dried potassium acrylate was added to the solution, with reaction continued 3 hours at 80° C. The reacted mixture was poured into water. After taken out of water, the mixture was rinsed with water and then methyl alcohol, providing 9 g of polymer.

Process 6

A polymer in which the character X of the general formula showed a combination of chlorine (Cl) and a group expressed by the formula of was produced by the following process. Reaction was carried out under substantially the same conditions as in Process 4, except that the acrylate used in said Process 4 was replaced by potassium crotonate. The reacted mixture was rinsed in the same manner as describe above. The rinsed product was dried, providing approximately 9 g of polymer.

Process 7

A polymer in which the character X of the general formula showed chlorine (Cl) and the character $R_1$ denoted methyl was prepared by the following process. 30 g of poly α-methyl styrene having weight average molecular weight of 52,000 was dissolved in 1900 ml of chloromethyl methyl ether, 50 ml of a solution of stannic tetrachloride was dripped into said poly α-methyl styrene solution, with reaction continued 90 minutes at 0° C. The reaction product was purified by the precipitation with methanol used as a medium. As a result, 35 g of chloromethylated poly α-methyl styrene was produced.

The elemental analysis of the polymer indicated 73.2% by weight of carbon, 7.1% by weight of hydrogen and 19.7% by weight of chlorine.

Process 8

A polymer in which the character X of the general structural formula showed a combination of chlorine (Cl) and bromine (Br) and the character $R_1$ thereof denoted methyl was produced by the following process. 10 g of chloromethylated poly α-methyl styrene produced by the process 7 was dissolved in 50 ml of N, N'-dimethyl formamide. 12 g of crushed and dried KBr was added to the solution, with reaction continued 3 hours at 80° C. The reacted mixture was poured into water. After taken out of the water, the mixture was rinsed with water and methyl alcohol, and dried at reduced pressure, providing 8 g of polymer.

Process 9

A polymer in which the character X of the general structural formula denoted a combination of chlorine (Cl) and iodine (I) and the character $R_1$ thereof represented methyl was prepared by the following process. 10 g of chloromethylated poly α-methyl styrene obtained by the process 7 was dissolved in 50 ml of N, N'-dimethyl formamide. 12 g of crushed and dried KI was added to the solution, with reaction continued 3 hours at 80° C. The reacted mixture was poured into water. After taken out of the water, the mixture was rinsed with water and methyl alcohol. The rinsed product was dried at reduced pressure, providing 7.5 g of chloro-iodo-methylated poly α-methylstyrene.

Process 10

A polymer in which the character X of the general structural formula represented a combination of chlorine (Cl) and a group expressed by the formula of and the character $R_1$ thereof denoted methyl was produced by the following process.

10 g of chloromethylated poly α-methyl styrene prepared by the process 7 was dissolved in 50 ml of N, N'-dimethyl formamide. 12 g of crushed and dried KI was added to the solution, with reaction continued 3 hours at 80° C. The reacted mixture was poured into water. After taken out of water, the mixture was rinsed with water and methyl alcohol. The rinsed mixture was dried at reduced pressure, providing 8.5 g of polymer.

Table 1 below indicates the weight molecular weights, polydispersivity (Mw/Mn, where Mw is the weight average molecular weight and Mn is the number average molecular) weight and γ values of the respective polymers produced by the above-mentioned processes 1 to 10.

TABLE 1

| Process No. | Formula of a component subscribed by the character m of the general structural formula | Weight Average molecular weight ($\times 10^4$) | Dispersion rate (Mw/Mn) | Sensitivety to high energy beams (C/cm$^2$) | $\gamma$ Value |
|---|---|---|---|---|---|
| 1 | $+CH_2-CH)_m$ with phenyl bearing $(ClH_2C)_n$ | 1.8 | 1.1 | $1 \times 10^{-5}$ | 2.2 |
| 2 | $+CH_2-CH)_m$ with phenyl bearing $(ClH_2C)_n$ | 1.13 | 1.7 | $2 \times 10^{-7}$ | 1.4 |
| 3** | $+CH_2-CH)_{m1}(CH_2-CH)_{m2}$ with phenyl-$(ClH_2C)_a$ and phenyl-$(CH_2Br)_b$ | 2.0 | 1.2 | $9 \times 10^{-6}$ | 1.5 |
| 4** | $+CH_2-CH)_{m1}(CH_2-CH)_{m2}$ with phenyl-$(ClH_2C)_a$ and phenyl-$(CH_2I)_b$ | 2.0 | 1.2 | $1.5 \times 10^{-5}$ | 1.6 |
| 5** | $+CH_2-CH)_{m1}(CH_2-CH)_{m2}$ with phenyl-$(ClH_2C)_a$ and phenyl-$(CH_2O\overset{O}{C}-CH=CH_2)_b$ | 2.1 | 1.3 | $2 \times 10^{-6}$ | 1.4 |
| 6** | $+CH_2-CH)_{m1}(CH_2-CH)_{m2}$ with phenyl-$(ClH_2C)_a$ and phenyl-$(CH_2O\overset{O}{C}-CH=CH-CH_3)_b$ | 2.2 | 1.3 | $1.5 \times 10^{-6}$ | 1.4 |
| 7 | $+CH_2-C(CH_3))_m$ with phenyl-$(ClH_2C)_n$ | 7.2 | 1.1 | $5.2 \times 10^{-6}$ | 2.0 |
| 8** | $+CH_2-C(CH_3))_{m1}(CH_2-C(CH_3))_{m2}$ with phenyl-$(ClH_2C)_a$ and phenyl-$(CH_2Br)_b$ | 9.5 | 1.3 | $4.0 \times 10^{-6}$ | 1.5 |
| 9** | $+CH_2-C(CH_3))_{m1}(CH_2-C(CH_3))_{m2}$ with phenyl-$(ClH_2C)_a$ and phenyl-$(CH_2I)_b$ | 10.6 | 1.2 | $6.0 \times 10^{-6}$ | 1.4 |

TABLE 1-continued

| Process No. | Formula of a component subscribed by the character m of the general structural formula | Weight Average molecular weight (× 10⁴) | Dispersion rate (Mw/Mn) | Sensitivety to high energy beams (C/cm²) | γ Value |
|---|---|---|---|---|---|
| 10** | $+CH_2-\underset{\underset{(ClH_2C)_a\text{-}\bigcirc}{\mid}}{\overset{CH_3}{\underset{\mid}{C}}}\!)_{\overline{m_1}}(CH_2-\underset{\underset{\bigcirc}{\mid}}{\overset{CH_3}{\underset{\mid}{C}}}\!)_{\overline{m_2}}$ $-(CH_2OC-CH=CH_2)_b$ with O double bond | 9.0 | 1.1 | $5.0 \times 10^{-7}$ | 1.4 |

Figure 2:
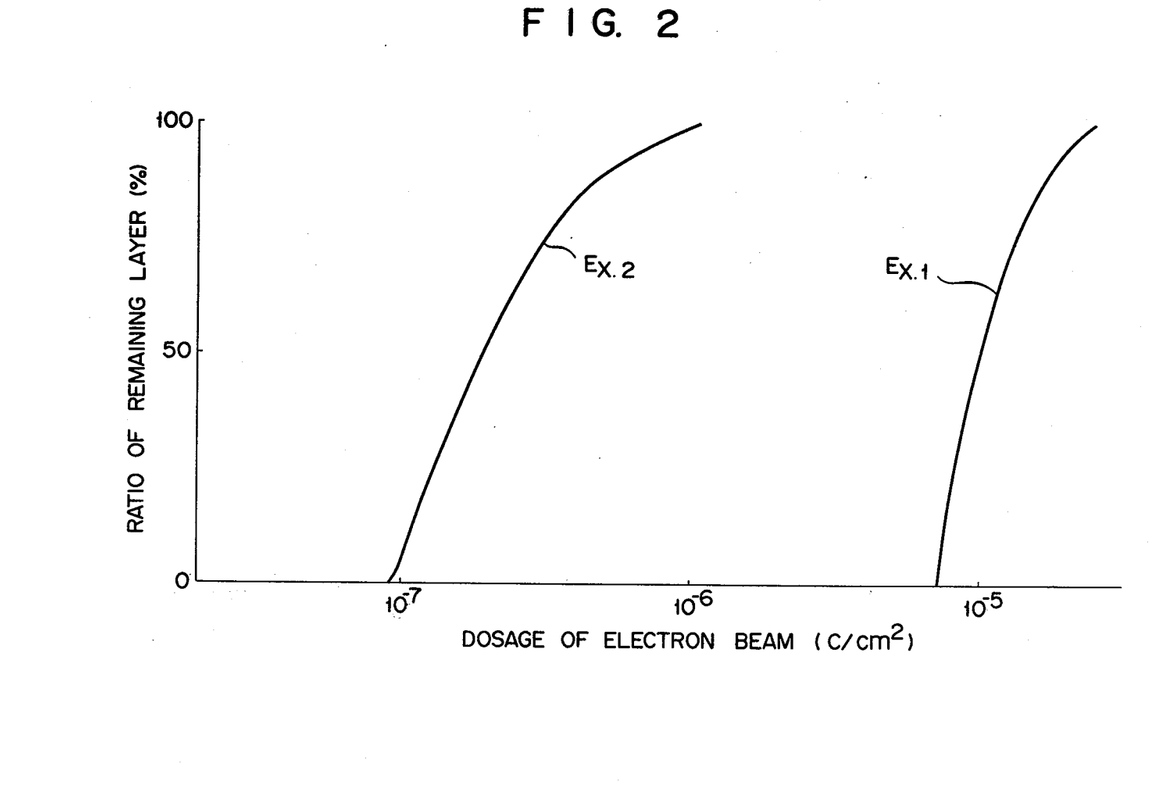
FIG. 2 shows a relationship between the dosage of electrons irradiated on the chloromethylated polystyrene and the percentage remnant amount of the electron-irradiated portion of said chloromethylated polystyrene.

*Measured by gel permeation chromatography
**The characters a, b attached to the formula of the component subscribed by the character m indicated in the general structural formula have relationships of a + b = n, a = 0 to 3, b = 0 to 3, and $m_1$, $m_2$ have a relationship of $m_1 + m_2 = m$.
***Dosage of electrons when the thickness S of the remnant resist film after development bears a ratio of 0.5 to the initial thickness $S_0$ of said resist film.
****γ = $[\log D_i/D_o]^{-1}$ where Do and Di show the dosages of electrons measured at points denoting $S/S_0 = 0$ and $S/S_0 = 1$ on a tangential line given in the curve diagram of FIG. 2 which indicates the percentage remnant amount of a resist film after exposed to radiation to the extent of $S/S_0 = 0.5$.

This invention will be more fully understood by reference to the examples which follow.

EXAMPLE 1

This example relates to the case where the chloromethylated polystyrene was used as a resist material to be exposed to electrons.

The subject polymer was dissolved in xylene at a concentration of 5% by weight. The solution was applied on the surface of, for example, a silicon substrate by spin coating to form a film having a uniform thickness of about 0.5 micron. The film was heated 20 minutes at 95° C. in streams of nitrogen. After cooled to room temperature, the film was exposed to electrons (accelerated by a voltage of 20 KV). The portions of the film exposed to the electrons were developed with a solvent consisting of n-amyl acetate and isopropanol mixed in the ratio of 4:1 V/V. The developed portions were rinsed with isopropanol.

FIG. 2 indicates the percentage thicknesses of the remnant polymer film after development corresponding to the electron dosages applied. At the electron dosage of $1 \times 10^{-5}$ Coulomb/cm², the polymer was retained to the extent of 50% of the initial thickness thereof. The surface of the remnant polymer film was scanned 5 times by electron beams having a diameter of 0.1 micron at a pitch of 0.2 micron. The scanned surface of the polymer film was developed and then rinsed with the same compositions as mentioned above, providing a resist pattern consisting of lines having a width of 0.8 to 1.2 microns.

EXAMPLE 2

This example relates to the case where the chloromethylated polystyrene (corresponding to Process 2) having the same chemical structure as the polymer used in Example 1 but a larger molecular weight than said polymer was used as a resist material to be exposed to electrons. The polymer was dissolved in xylene at a concentration of 5% by weight. The solution was applied on the surface of a substrate of, for example, $SiO_2$, Si or Al to provide a polymer film having a thickness of about 0.5 micron. After heated 30 minutes at 95° C., the polymer film was exposed to electron beams. The electron-irradiated portions of the polymer film were developed with a solvent consisting of n-amyl acetate and isopropanol mixed in the ratio of 4:1, and then rinsed with isopropanol.

FIG. 2 shows the percentage thicknesses of the remnant polymer film after development corresponding to the electron dosages applied. At the electron dosage of $2 \times 10^{-7}$ Coulomb/cm², the polymer was retained to the extent of 50% of the original thickness. The surface of the developed polymer was scanned by electrons, followed by development and rinsing under the same conditions as in Example 1, providing a resist pattern consisting of lines having a width of 0.7 to 1.4 microns.

Further, determination was made of the resistance of the subject polymer to various radiations applied in dry etching. As seen from Table 2 below, a polysilicon substrate indicated an etching rate of 1400 Å/min with respect to reactive sputtering (using $CF_4$ gas and high frequency power of 350 W). In contrast, the subject chloromethylated polystyrene indicated an etching rate of 520 Å/min, a value about half that of the polysilicon substrate. The etching rate of 520 Å/min is about 0.3 time that of PMMA and 0.8 time that of AZ-1350 J, naphthoquinonediazido-based resist material (which is sold under a trademark of AZ-1350 J by shipley Co. Ltd. U.S.A.) which is generally considered to have a satisfactorily high resistance to a dry etchant. Therefore, the subject chloromethylated polystyrene is distinctly proved to have a high resistance to a dry etchant.

Further, when an aluminium substrate was etched to a depth of 6000 Å/min by a plasma of carbon tetrachloride, the subject chloromethylated polystyrene was etched, as shown in Table 3 below, only to a smaller extent than one-fourth of the etched depth of said aluminium substrate, and also to a smaller extent than two-thirds of the etched depth of the AZ-1350 J resist mask material. Therefore, the subject chloromethylated polystyrene is shown to have a prominent resistance to a dry etchant.

TABLE 2

Rate of etching by reactive sputtering as compared with that of a polysilicon substrate

| Resist mask material | Etching rate (A/min) |
|---|---|
| Polysilicon | 1400 |
| PMMA | 1600 |
| AZ-1350 J* | 660 |
| Chloromethylated | 520 |

TABLE 2-continued

Rate of etching by reactive sputtering as compared with that of a polysilicon substrate

| Resist mask material | Etching rate (A/min) |
| --- | --- |
| polystyrene | |

TABLE 3

Rate of etching by plasma as compared with that of an aluminium substrate

| Resist mask material | Etched depth (A) |
| --- | --- |
| Aluminium | 6000 |
| PMMA | 8000 |
| AZ-1350 J* | 2100 |
| Chloromethylated polystyrene | 1350 |

*naphthoquinonediazido-based resist material (which is sold under a trademark of AZ-1350 J by Shipley Co. Ltd. U.S.A.)

Further, it has been proved that the subject chloromethylated polystyrene can provide a resist pattern consisting of lines having a width of 1 micron by means of dry etching.

Figure 3:
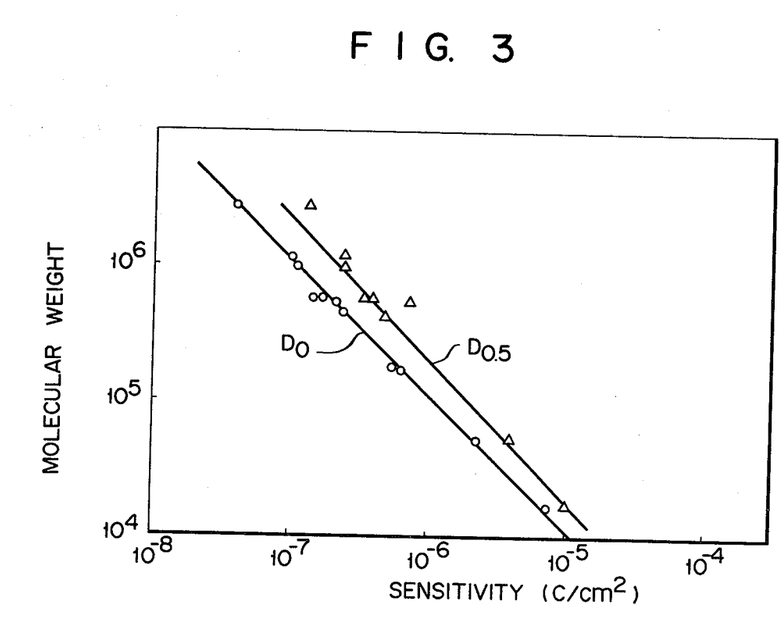
FIG. 3 is a curve diagram showing the relationship between the molecular weight and the radiation sensitivity of a polymer used in the method of the invention, wherein $D_0$ denotes a radiation dosage required for a gelation and $D_{0.5}$ denotes a radiation dosage required for leaving 50% of the initial layer.

It has also been disclosed that the molecular weight and the sensitivity to high energy beams of the subject chloromethylated polystyrene have a relationship as indicated in FIG. 3. Therefore, it is possible to design the concrete molecular weight of the subject chloromethylated polystyrene by controlling the molecular weight of raw polystyrene and the method of chloromethylation.

Further, this chloromethylated polystyrene has a sensitivity of 8 mJ/cm$^2$ against soft X rays consisting of MoL rays (16 KV, 200 mA), and a sensitivity 200 times as high as that of PMMA against deep ultraviolet rays (200 W deuterium lamp). $\gamma$ value of this chloromethylated polystyrene was 1.1 in regard to the soft X-rays and less than 10 with respect to the deep ultraviolet rays.

This chloromethylated polystyrene was further examined to determine its post-polymerization characteristics and compared with conventional resist materials i.e. poly(2-chloroethyl vinyl ether) and copolymer of glycidyl methacrylate and ethylacrylate, by measuring, in relation to the retaining time in a vacuum chamber after irradiation, the changes in thickness of the pattern layer remaining after the image development of the irradiated resist materials.

Figure 4:
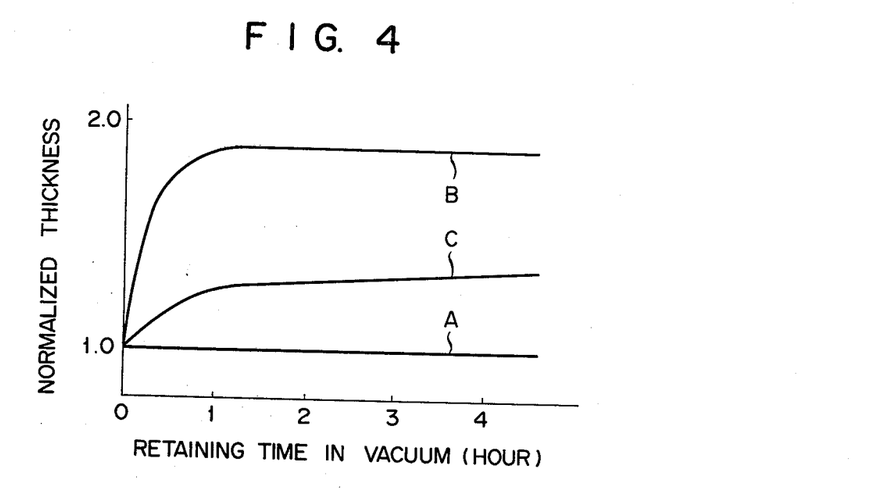
FIG. 4 is a curve diagram showing the relationship between the retaining time in vacuum of polymers and normalized thickness.

FIG. 4 shows results of the experiments wherein line A indicates that of the chloromethylated polystyrene, line B, that of copolymer of glycidyl methacrylate and ethylacrylate and line C, that of poly(2-chloroethyl vinyl ether).

When the chloromethylated polystyrene was irradiated with X-rays even in the atmosphere of air, a decline in sensitivity to X-rays in comparison to the sensitivity in vacuum was found to be minimal in contrast to a case wherein conventional resist material is employed.

Figure 5:
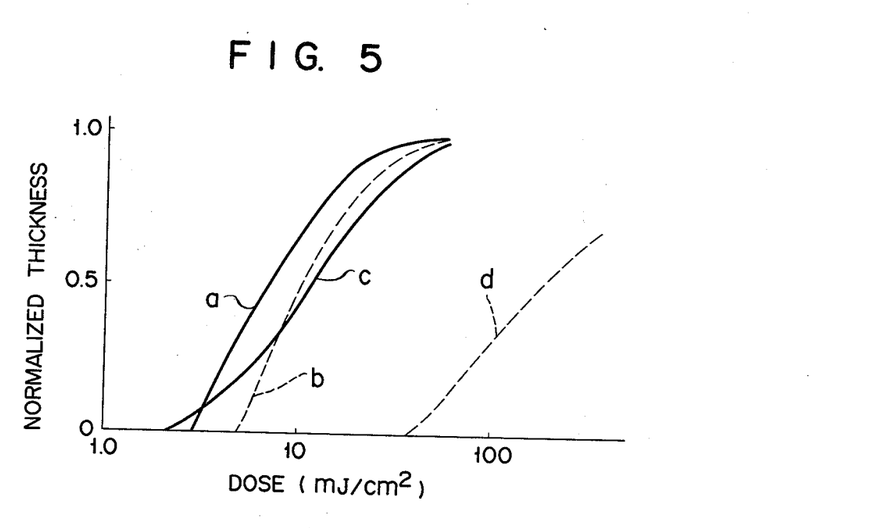
FIG. 5 is a curve diagram showing the relationship between the radiation dosage and normalized thickness.

FIG. 5 shows the results of the experiments wherein the solid line a and dotted line b indicate those of the chloromethylated polystyrene irradiated in vacuum and in air respectively, while the solid line c and dotted line d, those of chloroethyl vinyl ether-vinyloxyethylacrylate copolymer irradiated in vacuum and in air respectively.

EXAMPLE 3

This example relates to the case where the same polymer as used in Example 2 was applied as a resist material to be exposed to soft X-rays.

The subject polymer was coated on the surface of a silicon substrate to a thickness of about 0.5 micron to provide a polymer film. After heated 30 minutes at 95° C., the polymer film was exposed to soft X-rays having a wavelength of 5.4 Å which was emitted from a water-cooled rotary molybdenum target. X-rays were applied at the rate of 12 m J/cm$^2$ to etch the polymer film to the extent of 50% of the original thickness thereof. In this case, a $\gamma$ value used as a guide to estimate the degree of resolution by said polymer film exposed to soft X-rays was 1.4. When soft X-rays were irradiated under the condition of 10 K l and 100 mA through a mask consisting of an Au absorbent and Si carrier, a resist pattern was formed in 3 minutes, with a resolution degree of 0.8 micron.

EXAMPLE 4

This example relates to the case where the same polymer as used in Example 2 was applied as a resist material to be exposed to deep ultraviolet rays. The subject polymer was applied on the surface of a silicon substrate to a thickness of about 0.5 micron to provide a polymer film. After heated 30 minutes at 95° C., the polymer film was exposed to deep ultraviolet rays delivered from a 200 W deuterium laamp. The deep ultraviolet rays were applied until the polymer film was etched to the extent of 50% of the original thickness thereof. The dosage of ultraviolet rays thus applied accounted for 1/200 of that which was required in the case of poly(methyl methacrylate) and 1/560 of that which was used in the case of polystyrene.

When the polymer film was exposed to high energy beams issued from a Xe-Hg lamp operated at 500 W through a chromium mask, a resist pattern was formed in one second with a resolution degree of 1 micron.

EXAMPLE 5

This example relates to the case where the chloromethylated poly($\alpha$-methyl styrene) styrene obtained by Process 7 was used as a resist mask material to be exposed to electron beams.

The subject polymer was dissolved in xylene at a concentration of 15% by weight. The solution was applied on the surface of a silicon substrate to a uniform thickness of 0.5 micron by spin coating to provide a polymer film. After heated 20 minutes at 95° C. in nitrogen streams, and cooled to room temperature, the polymer film was exposed to electron beams (accelerated with a voltage of 20 KV). The portions of the polymer film exposed to electron beams were developed with benzene and rinsed with isopropanol. Electron beams were applied at the rate of $5.2 \times 10^{-6}$ Coulomb/cm$^2$, until the polymer film was etched to the extent of 50% of the original thickness thereof. In this case, the $\gamma$ value of the polymer film exposed to electrons beams which was used as a guide to estimate its resolution degree was 2.0.

EXAMPLE 6

The patterned resist produced in Examples 2 and 3 were purposely heated to find their dimensional changes. When the resist were heated from room temperature to 200° C. in an electric heater, their patterns were not deformed, proving that the resist has a prominent resistance to heat.

As mentioned above, a polymer used in the method of this invention comprises polystyrene or poly α-methyl styrene as the base of the composition and includes a halogen or an unsaturated group as expressed by the aforesaid general structural formula. Therefore, the subject polymer sensitively reacts with high energy beams and noticeably change in solubility, thereby allowing for the easy formation of a fine resist pattern. Moreover, the subject polymer has a high resistance to a dry etchant and is well adapted for the etching of a substrate. Further, a resist material formed of polystyrene or poly α-methylstyrene produced by living polymerization with a narrow distribution of a molecular weight is increased in the degree of resolution.

There will now be listed the advantages of a polymer prepared by the method of this invention.

(a) The polymer whose unit structure contains a halogen or unsaturated group has as high a sensitivity to high energy beams as $10^{-5}$ to $10^{-8}$ Coulomb/cm$^2$. The larger $\gamma$ value of the polymer than 1.4 elevates the degree of resolution to a level finer than 1 micron.

(b) The polymer whose unit structure contains a halogen or a benzene ring has a prominent resistance to heat and particularly a dry etchant. Therefore, the polymer is well adapted for the etching of a substrate of aluminium or polysilicon with an extremely small width of 1 micron.

(c) Cross-linking reaction does not proceed in vacuum after the exposure of the polymer to high energy beams. Therefore, the polymer is substantially saved from the adverse effect of the so-called post-polymerization.

(d) Even when irradiated in the atmosphere of air, a negative resist prepared from the subject polymer is little likely to decline in sensitivity to high energy beams, as is often experienced with a negative resist material.

What we claim is:

1. A methd of forming a negative resist pattern which comprises the steps of:
   (a) depositing a polymer film sensitive to high energy beams on a substrate;
   (b) exposing the polymer film to high energy beams applied by deep ultraviolet rays, X-rays, electron beams or gamma rays in a prescribed pattern to crosslink the exposed portions of the film; and
   (c) removing the portions of the film other than the crosslinked portions with a solvent, wherein the polymer is formed of components expressed by the general structural formula:

wherein
X is the same or different groups selected from the group consisting of halogens and groups of the formula wherein R$_2$ is a hydrogen atom or methyl group;
R$_1$ is a hydrogen atom or methyl group;
n is an integer of 1, 2 or 3; and
l+m are each an integer and the total of all the l and m integers in the polymer are in the range of 50 to 50,000, and m/m+l≧0.2.

2. The method according to claim 1, wherein X is at least one element selected from the group consisting of chlorine, iodine and bromine.

3. The method according to claim 1, wherein R$_1$ is a hydrogen atom.

4. The method according to claim 1, wherein R$_1$ is methyl group.

5. The method according to claim 1, wherein R$_2$ is methyl group.

6. The method according to any one of claims 1, 3, 4, and 5, wherein the character X of the general structural formula is chlorine.

7. The method according to claim 1, wherein the dispersivity range of the polymer is smaller than 1.2.

8. The method according to claim 6, wherein the dispersivity range of the polymer is smaller than 1.2.

9. The method according to claim 4, wherein R$_2$ is methyl group.

* * * * *